(12) United States Patent  
Mitsuyoshi

(10) Patent No.: US 8,500,915 B2  
(45) Date of Patent: Aug. 6, 2013

(54) SUBSTRATE TRANSPORTING APPARATUS, SUBSTRATE PLATFORM SHELF AND SUBSTRATE PROCESSING APPARATUS

(75) Inventor: Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/886,063

(22) Filed: Sep. 20, 2010

(65) Prior Publication Data

US 2011/0008148 A1 Jan. 13, 2011

Related U.S. Application Data

(62) Division of application No. 11/958,816, filed on Dec. 18, 2007, now abandoned.

(30) Foreign Application Priority Data

Dec. 27, 2006 (JP) .................................. 2006-352000

(51) Int. Cl.
*B08B 7/00* (2006.01)
(52) U.S. Cl.
USPC .................................. 134/33; 134/32; 134/42
(58) Field of Classification Search
None
See application file for complete search history.

(56) References Cited

U.S. PATENT DOCUMENTS

| 5,989,346 | A | 11/1999 | Hiroki | |
|---|---|---|---|---|
| 6,143,083 | A * | 11/2000 | Yonemitsu et al. | 118/719 |
| 6,874,515 | B2 | 4/2005 | Ishihara et al. | |
| 2005/0028928 | A1 * | 2/2005 | Asa | 156/345.5 |
| 2006/0098978 | A1 * | 5/2006 | Yasuda et al. | 396/611 |
| 2006/0182529 | A1 | 8/2006 | Hiroki | |
| 2012/0201634 | A1 | 8/2012 | Hiroki | |

FOREIGN PATENT DOCUMENTS

| CN | 1698191 | | 11/2005 |
|---|---|---|---|
| JP | 8-70033 | | 3/1996 |
| JP | 10-150090 | | 6/1998 |
| JP | 10150090 | A * | 6/1998 |
| JP | 11-130250 | | 5/1999 |
| JP | 11-130254 | | 5/1999 |
| JP | 11-165863 | | 6/1999 |
| KR | 10-2006-0077960 | | 7/2006 |
| TW | 318258 | | 10/1997 |

OTHER PUBLICATIONS

Related to U.S. Appl. No. 11/959,085, filed Dec. 18, 2007 by Ichiro Mitsuyoshi.
Related to U.S. Appl. No. 11/958,996, filed Dec. 18, 2007 by Ichiro Mitsuyoshi.
Related to U.S. Appl. No. 11/958,891, filed Dec. 18, 2007 by Ichiro Mitsuyoshi et al.
Office Action dated Apr. 20, 2009 issued in connection with corresponding Korean Patent Application No. 10-2007-0135430.
Notice of Reasons for Refusal issued Sep. 14, 2010 in connection with corresponding Japanese Patent Application No. 2006-352000.
Office Action issued Dec. 29, 2011 in connection with corresponding Taiwanese patent application.
Issued counterpart Chinese Patent No. 101872736 dated Oct. 24, 2012.

* cited by examiner

*Primary Examiner* — Nicole Blan
(74) *Attorney, Agent, or Firm* — Ostrolenk Faber LLP

(57) ABSTRACT

In a substrate processing apparatus consisting of an indexer block and a processing block, a substrate is transported between the indexer block and the processing block by an indexer robot. The indexer robot includes two hands that are provided one above the other on a rotating stage. The other hand moves in a vertical direction to one hand. A difference in height between the one hand and the other hand can be adjusted so as to be equal to spacing between substrate storing grooves of a carrier where the substrate that is to be carried into the indexer block is stored. In addition, the difference in height between the one hand and the other hand can be adjusted so as to be equal to spacing between support plates of a substrate platform provided between the indexer block and the processing block.

2 Claims, 11 Drawing Sheets

SUBSTRATE TRANSPORTING APPARATUS, SUBSTRATE PLATFORM SHELF AND SUBSTRATE PROCESSING APPARATUS

CROSS-REFERENCE TO RELATED APPLICATIONS

The present application is a Divisional Application of U.S. Ser. No. 11/958,816 filed Dec. 18, 2007, which claims benefit and priority to Japanese Patent Application No. 2006-352000 filed Dec. 27, 2006, both incorporated by reference; and is related to the following three applications filed Dec. 18, 2007, and commonly owned: (1) SUBSTRATE PROCESSING APPARATUS AND SUBSTRATE PROCESSING METHOD, U.S. Ser. No. 11/958,891; (2) SUBSTRATE PROCESSING APPARATUS, U.S. Ser. No. 11/958,996; (3) SUBSTRATE PROCESSING APPARATUS, U.S. Ser. No. 11/959,085.

BACKGROUND OF THE INVENTION

1. Field of the Invention

The present invention relates to a substrate transporting apparatus that transports a substrate, a substrate platform shelf where the substrate is placed and a substrate processing apparatus that processes the substrate.

2. Description of the Background Art

Substrate processing apparatuses have been conventionally used to perform various types of processes on substrates such as semiconductor wafers, glass substrates for photomasks, glass substrates for liquid crystal displays, glass substrates for plasma displays, substrates for optical disks, substrates for magnetic disks, substrates for magneto-optical disks or the like.

The substrate processing apparatus described in JP 10-150090 A is explained as an example of the substrate processing apparatus. FIG. 11 is a plan view showing the substrate processing apparatus described in JP 10-150090 A. As shown in FIG. 11, this substrate processing apparatus 900 includes an indexer 910 and a processing module 920.

The indexer 910 includes an indexer robot 912 that moves back and forth along an indexer transport path 911 that linearly extends and a cassette platform 913 where a plurality of carriers C can be placed along the indexer transport path 911. The plurality of substrates W are stored in the carriers C.

The processing module 920 includes a main transport robot 922 that moves back and forth along a main transport path 921 that is perpendicular to the indexer transport path 911 and a pair of unit sections 930A, 930B provided such that the main transport path 921 is sandwiched therebetween. Processing chambers 933, 934 for performing processing on the substrate W are provided in each of the unit sections 930A, 930B. In the substrate processing apparatus 900, transportation of the substrate W is performed as follows.

First, the carrier C is carried into the cassette platform 913 from outside of the substrate processing apparatus 900. Then, the unprocessed substrate W stored in the carrier C is taken out by the indexer robot 912 and transferred to the main transport robot 922.

The substrate W transferred to the main transport robot 922 is carried into the processing chambers 933, 934 and subjected to cleaning processing. Thereafter, the processed substrate W is again stored in the carrier C by the main transport robot 922 and the indexer robot 912.

In the above-described substrate processing apparatus 900, the indexer robot 912 includes a substrate taking out arm for taking the unprocessed substrate W out of the carrier C and a substrate storing arm for storing the processed substrate W in the carrier C.

For example, the indexer robot 912 takes the unprocessed substrate W out of the carrier C and transports it, and transfers the substrate W to the main transport robot 922. Also, the indexer robot 912 receives the processed substrate W from the main transport robot 922 and transports it, and stores the substrate W in the carrier C.

In the operation of the indexer robot 912, the carrier C of which the indexer robot 912 takes the unprocessed substrate W out and the carrier C in which the indexer robot 912 stores the processed substrate W are different from each other in some cases.

In this case, after storing the processed substrate W in one carrier C, the indexer robot 912 must move along the indexer transport path 911 toward the other carrier C in which the unprocessed substrate W is stored. This prevents the throughput in the substrate processing apparatus 900 from being improved.

Therefore, it is proposed that the operation speed of the indexer robot 912 is increased to improve the throughput in the substrate processing apparatus 900. However, the operation speed of the indexer robot 912 can not be remarkably increased due to the following reasons.

In the carriers C, the spacing for storing the substrates W is very small in order to store more of the substrate W. Thus, the substrate taking out arm and the substrate storing arm of the indexer robot 912 are manufactured so that their radial thicknesses are small, corresponding to the spacing for storing the substrate W in the carriers C. Therefore, rigidity of the substrate taking out arm and the substrate storing arm is not very high.

Accordingly, if the operation speed of the indexer robot 912 is remarkably increased, vibration, deformation or the like is generated to each of the arms. This causes poor transportation of the substrate W.

SUMMARY OF THE INVENTION

It is an object of the present invention to provide a substrate transporting apparatus, a substrate platform shelf and a substrate processing apparatus capable of sufficiently reducing transport time of a substrate.

(1) According to an aspect of the present invention, a substrate transporting apparatus that transports a substrate between a storing container having a plurality of stages of storing grooves where the substrate is stored in a substantially horizontal posture and a substrate platform shelf having a plurality of stages of storing shelves where the substrate is placed in the substantially horizontal posture includes first and second substrate holders that are provided one above the other and hold the substrate in the substantially horizontal posture, a driving mechanism that advances and withdraws the first and second substrate holders in a substantially horizontal direction while moving the first and second substrate holders for transferring and receiving the substrate to and from the storing container and transferring and receiving the substrate to and from the substrate platform shelf, and an adjusting mechanism that adjusts a difference in height between the first and second substrate holders, wherein the adjusting mechanism adjusts the difference in height between the first and second substrate holders to be the same as a difference in height between the storing grooves of the storing container when the substrate is transferred and received between the storing container and the first and second substrate holders and adjusts the difference in height between the first and second substrate holders to be the same as a difference in height between the storing shelves of the substrate platform shelf when the substrate is transferred and received between the substrate platform shelf and the first and second substrate holders.

The substrate transporting apparatus transfers and receives the substrate to and from the storing container having the plurality of stages of storing grooves by using the first and second substrate holders that are provided one above the other. The difference in height between the first and second substrate holders is adjusted to be the same as the difference in height between the storing grooves of the storing container by the adjusting mechanism when the substrate is transferred and received.

Thus, the first and second substrate holders can be easily inserted between the storing grooves of the storing container, respectively, by being advanced in the substantially horizontal direction by the driving mechanism. Accordingly, the plurality of substrates are smoothly transferred and received between the first and second substrate holders and the storing grooves of the storing container.

In addition, the substrate transporting apparatus transfers and receives the substrate to and from the substrate platform shelf having the plurality of stages of storing shelves by using the first and second substrate holders. The difference in height between the first and second substrate holders is adjusted to be the same as the difference in height between the storing shelves of the substrate platform shelf by the adjusting mechanism when the substrate is transferred and received.

Thus, the first and second substrate holders can be easily inserted between the storing shelves of the substrate platform shelf, respectively, by being advanced in the substantially horizontal direction by the driving mechanism. Accordingly, the plurality of substrates are smoothly transferred and received between the first and second substrate holders and the storing shelves of the substrate platform shelf.

As described above, even though the difference in height between the storing grooves of the storing container and the difference in height between the storing shelves of the substrate platform shelf are different from each other, the first and second substrate holders can simultaneously transfer and receive the plurality of substrates to and from the storing container and to and from the substrate platform shelf. This allows the transport time of the substrate to be sufficiently reduced.

(2) The driving mechanism may individually advance and withdraw the first and second substrate holders in the substantially horizontal direction for transferring and receiving the substrate to and from the storing container and for transferring and receiving the substrate to and from the substrate platform shelf.

In this case, the first and second substrate holders are individually advanced and withdrawn in the substantially horizontal direction. This allows the single substrate to be transferred and received between the first or second substrate holders and the storing container. Moreover, the single substrate can be transferred and received between the first or second substrate holders and the substrate storing shelf.

(3) According to another aspect of the present invention, a substrate platform shelf for transferring and receiving a substrate between a first substrate transporting apparatus having first and second substrate holders that are provided one above the other and a second substrate transporting apparatus having third and fourth substrate holders that are provided one above the other includes a plurality of stages of storing shelves that support the substrates in substantially horizontal postures respectively and an adjusting mechanism that adjusts a difference in height between the storing shelves, wherein the adjusting mechanism adjusts the difference in height between the storing shelves to be the same as a difference in height between the first and second substrate holders when the substrate is transferred and received to and from the first substrate transporting apparatus and adjusts the difference in height between the storing shelves to be the same as a difference in height between the third and fourth substrate holders when the substrate is transferred and received to and from the second substrate transporting apparatus.

In the substrate platform shelf, the substrate is transferred and received between the plurality of stages of storing shelves that support the substrate in the substantially horizontal posture and the first substrate transporting apparatus.

The difference in height between the storing shelves is adjusted to be the same as the difference in height between the first and second substrate holders by the adjusting mechanism when the substrate is transferred and received. This allows the first and second substrate holders to be easily inserted between the storing shelves, respectively. Accordingly, the plurality of substrates are smoothly transferred and received between the plurality of stages of storing shelves and the first substrate transporting apparatus.

In addition, the substrate is transferred and received between the storing shelf and the second substrate transporting apparatus in this substrate platform shelf. The difference in height between the storing shelves is adjusted to be the same as the difference in height between the third and fourth substrate holders by the adjusting mechanism when the substrate is transferred and received. This allows the third and fourth substrate holders to be easily inserted between the storing shelves, respectively. Accordingly, the plurality of substrates are smoothly transferred and received between the plurality of stages of storing shelves and the second substrate transporting apparatus.

As described above, since the difference in height between the storing shelves can be adjusted by the adjusting mechanism, the plurality of substrates can be simultaneously transferred and received between the plurality of stages of storing shelves and the first and second substrate transporting apparatuses, even though the difference in height between the first and second substrate holders of the first substrate transporting apparatus and the difference in height between the third and fourth substrate holders of the second substrate transporting apparatus are different from each other. This allows the transport time of the substrate to be sufficiently reduced.

(4) Each stage of the storing shelves may include a set of shelves arranged at a predetermined spacing within a substantially horizontal plane and a plurality of support members that are provided in the set of shelves and support a lower surface of the substrate.

In this case, a space is formed between the shelves on each stage of the storing shelves. This allows the first and second substrate holders to be more easily inserted into the space formed between the shelves when the substrate is transferred and received between the plurality of stages of storing shelves and the first substrate transporting apparatus.

Furthermore, the third and fourth substrate holders can be more easily inserted into the space formed between the shelves when the substrate is transferred and received between the plurality of stages of storing shelves and the second substrate transporting apparatus.

Accordingly, the plurality of substrates are more smoothly transferred and received between the plurality of stages of storing shelves and the first substrate transporting apparatus and between the plurality of stages of storing shelves and the second substrate transporting apparatus.

(5) According to still another aspect of the present invention, a substrate processing apparatus that performs processing on a substrate includes a processing region for processing the substrate, a carrying in and out region for carrying the substrate into and out of the processing region, and an interface that transfers and receives the substrate between the processing region and the carrying in and out region, wherein the carrying in and out region includes a container platform where a storing container having a plurality of stages of storing grooves for storing the substrate in a substantially horizontal posture is placed and a first substrate transporting apparatus that transports the substrate between the storing container placed in the container platform and the interface, the processing region includes a processing unit that performs processing on the substrate and a second substrate transporting apparatus that transports the substrate between the interface and the processing unit, the interface includes a substrate platform shelf having a plurality of stages of storing shelves where the substrate is placed in the substantially horizontal posture, the first substrate transporting apparatus includes first and second substrate holders that are provided on above the other and hold the substrate in the substantially horizontal posture, a driving mechanism that advances and withdraws the first and second substrate holders in a substantially horizontal direction while moving the first and second substrate holders for transferring and receiving the substrate to and from the storing container and for transferring and receiving the substrate to and from the substrate platform shelf and an adjusting mechanism that adjusts a difference in height between the first and second substrate holders and the adjusting mechanism adjusts the difference in height between the first and second substrate holders to be the same as a difference in height between the storing grooves of the storing container when the substrate is transferred and received between the storing container and the first and second substrate holders and adjusts the difference in height between the first and second substrate holders to be the same as a difference in height between the storing shelves of the substrate platform shelf when the substrate is transferred and received between the substrate platform shelf and the first and second substrate holders.

In the substrate processing apparatus, the storing container is placed in the container platform in the carrying in and out region. The substrates are stored in substantially horizontal postures in the plurality of storing grooves of the storing container. The first substrate transporting apparatus in the carrying in and out region transports the substrate between the storing container on the container platform and the substrate platform shelf in the interface. The substrates are placed in the substantially horizontal postures in the plurality of stages of storing shelves of the substrate platform shelf.

The second substrate transporting apparatus in the processing region transports the substrate between the substrate platform shelf in the interface and the processing unit. Thus, the substrate stored in the storing container in the carrying in and out region is transported by the first and second substrate transporting apparatuses to be processed in the processing unit. Moreover, the substrate processed in the processing unit is transported by the second and first substrate transporting apparatuses to be stored in the storing container in the carrying in and out region.

The first substrate transporting apparatus transfers and receives the substrate to and from the storing container having the plurality of stages of storing grooves by using the first and second substrate holders that are provided one above the other. The difference in height between the first and second substrate holders is adjusted to be the same as the difference in height between the storing grooves of the storing container by the adjusting mechanism when the substrate is transferred and received.

This allows the first and second substrate holders to be easily inserted between the storing grooves of the storing container, respectively, by being advanced in the substantially horizontal direction by the driving mechanism. Thus, the plurality of substrates are smoothly transferred and received between the first and second substrate holders and the storing grooves of the storing container.

Moreover, the first substrate transporting apparatus transfers and receives the substrate to and from the substrate platform shelf having the plurality of stages of storing shelves by using the first and second substrate holders. The difference in height between the first and second substrate holders is adjusted to be the same as the difference in height between the storing shelves of the substrate platform shelf by the adjusting mechanism when the substrate is transferred and received.

Accordingly, the first and second holders can be easily inserted between the storing shelves of the substrate platform shelf, respectively, by being advanced in the substantially horizontal direction by the driving mechanism. Accordingly, the plurality of substrates are smoothly transferred and received between the first and second substrate holders and the storing shelves of the substrate platform shelf.

As described above, even though the difference in height between the storing grooves of the storing container and the difference in height between the storing shelves of the substrate platform shelf are different from each other, the first and second substrate holders of the first substrate transporting apparatus can simultaneously transfer and receive the plurality of substrates to and from the storing container and to and from the substrate platform shelf. As a result, the transport time of the substrate is sufficiently reduced and the throughput in the substrate processing is sufficiently improved.

(6) The processing unit may include a cleaning processing unit that cleans the substrate. In this case, the substrate is cleaned by the cleaning processing unit.

(7) According to a further aspect of the present invention, a substrate processing apparatus that performs processing on a substrate includes a processing region for processing a substrate, a carrying in and out region for carrying the substrate into and out of the processing region, and an interface that transfers and receives the substrate between the processing region and the carrying in and out region, wherein the carrying in and out region includes a container platform where a storing container having a plurality of stages of storing grooves for storing the substrate in a substantially horizontal posture is placed, a first substrate transporting apparatus having first and second substrate holders that are provided one above the other and transports the substrate between the storing container placed in the container platform and the interface, the processing region includes a processing unit that performs processing on the substrate and a second substrate transporting apparatus having third and fourth substrate holders that are provided one above the other and transports the substrate between the interface and the processing unit, the interface includes a substrate platform shelf having a plurality of stages of storing shelves where the substrate is placed in the substantially horizontal posture, the substrate platform shelf includes a plurality of stages of storing shelves that support the substrates in the substantially horizontal postures, respectively, and an adjusting mechanism that adjust a difference in height between the storing shelves and the adjusting mechanism adjusts the difference in height between the storing shelves to be the same as a difference in height between the first and second substrate holders when the substrate is transferred and received to and from the first substrate transporting apparatus and adjusts the difference in height between the storing shelves to be the same as a difference in height between the third and fourth substrate holders when the substrate is transferred and received to and from the second substrate transporting apparatus.

In the substrate processing apparatus, the storing container is placed in the container platform in the carrying in and out region. The substrates are stored in the substantially horizontal postures in the plurality of storing grooves of the storing container. The first substrate transporting apparatus in the carrying in and out region transports the substrate between the storing container on the container platform and the substrate platform shelf in the interface. The substrates are placed in the substantially horizontal postures in the plurality of stages of storing shelves of the substrate platform shelf.

The second substrate transporting apparatus in the processing region transports the substrate between the substrate platform shelf in the interface and the processing unit. Thus, the substrate stored in the storing container in the carrying in and out region is transported by the first and second substrate transporting apparatuses to be processed in the processing unit. Moreover, the substrate processed in the processing unit is transported by the second and first substrate transporting apparatuses to be stored in the storing container in the carrying in and out region.

The first substrate transporting apparatus transfers and receives the substrate to and from the substrate platform shelf having the plurality of stages of storing shelves by using the first and second substrate holders that are provided one above the other. The difference in height between the storing shelves is adjusted to be the same as the difference in height between the first and second substrate holders by the adjusting mechanism when the substrate is transferred and received. This allows the first and second substrate holders to be easily inserted between the storing shelves, respectively. Thus, the plurality of substrates are smoothly transferred and received between the plurality of stages of storing shelves and the first substrate transporting apparatus.

Moreover, the second substrate transporting apparatus transfers and receives the substrate to and from the substrate platform shelf having the plurality of stages of storing shelves by using the third and fourth substrate holders that are provided one above the other. The difference in height between the storing shelves is adjusted to be the same as the difference in height between the third and fourth substrate holders by the adjusting mechanism when the substrate is transferred and received. This allows the third and fourth substrate holders to be easily inserted between the storing shelves, respectively. Accordingly, the plurality of substrates are smoothly transferred and received between the plurality of stages of storing shelves and the second substrate transporting apparatus.

As described above, since the difference in height between the storing shelves can be adjusted by the adjusting mechanism, the plurality of substrates can be simultaneously transferred and received between the plurality of stages of storing shelves and the first and second substrate transporting apparatuses, even though the difference in height between the first and second substrate holders of the first substrate transporting apparatus and the difference in height between the third and fourth substrate holders of the second substrate transporting apparatus are different from each other. As a result, the transport time of the substrate is sufficiently reduced and the throughput in the substrate processing is sufficiently improved.

(8) The processing unit may include a cleaning processing unit that cleans the substrate. In this case, the substrate is cleaned by the cleaning processing unit.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate transporting apparatus, a substrate platform shelf and a substrate processing apparatus according to one embodiment of the present invention are described. In the following description, a substrate refers to a semiconductor wafer, a glass substrate for a photomask, a glass substrate for a liquid crystal display, a glass substrate for a plasma display, a substrate for an optical disk, a substrate for a magnetic disk, a substrate for a magneto-optical disk or the like.

[1] First Embodiment (1) Configuration of a Substrate Processing Apparatus

Figure 1:
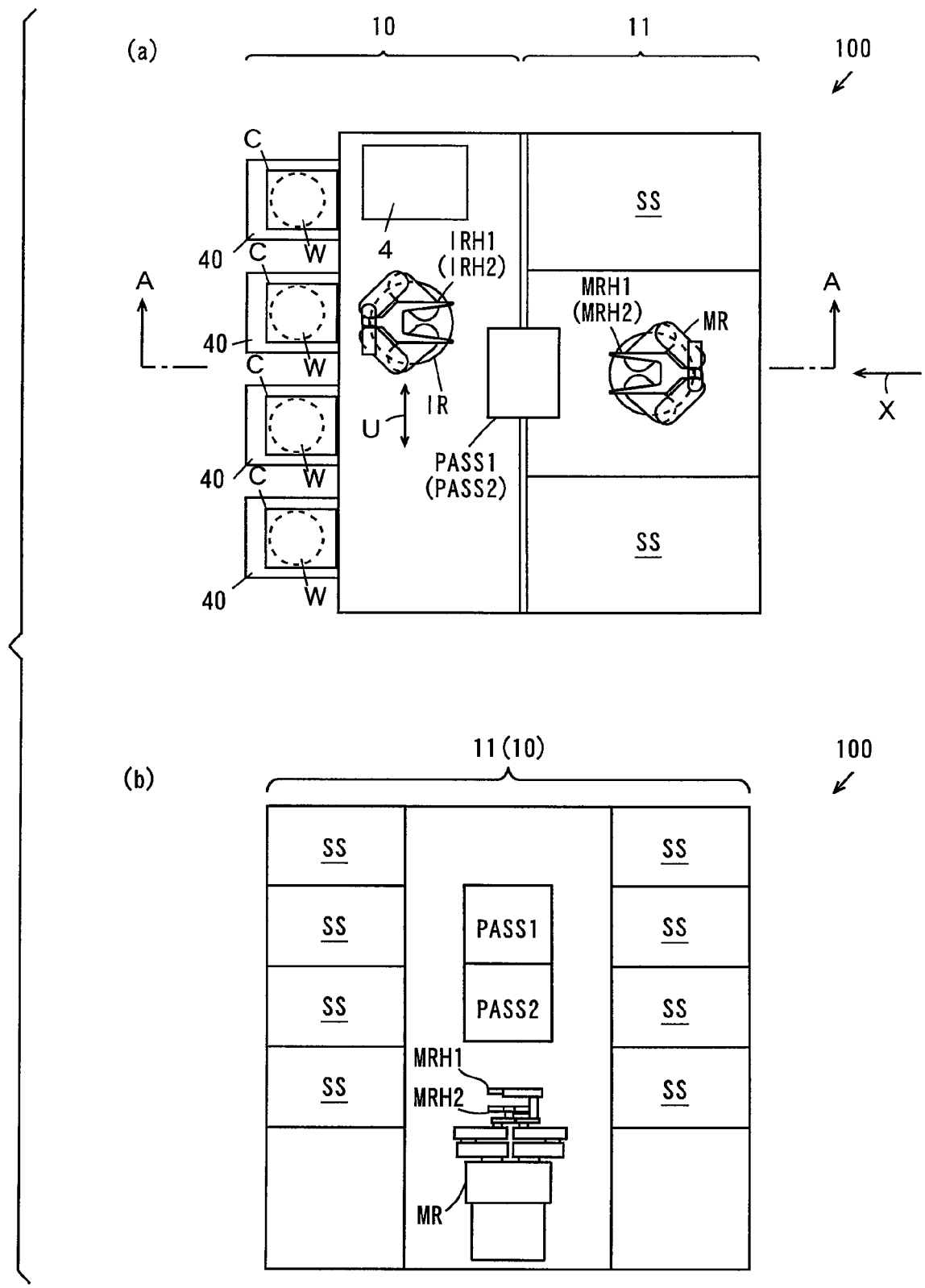
FIG. 1 is a plan view and a schematic side view of a substrate processing apparatus according to a first embodiment.
Figure 2:
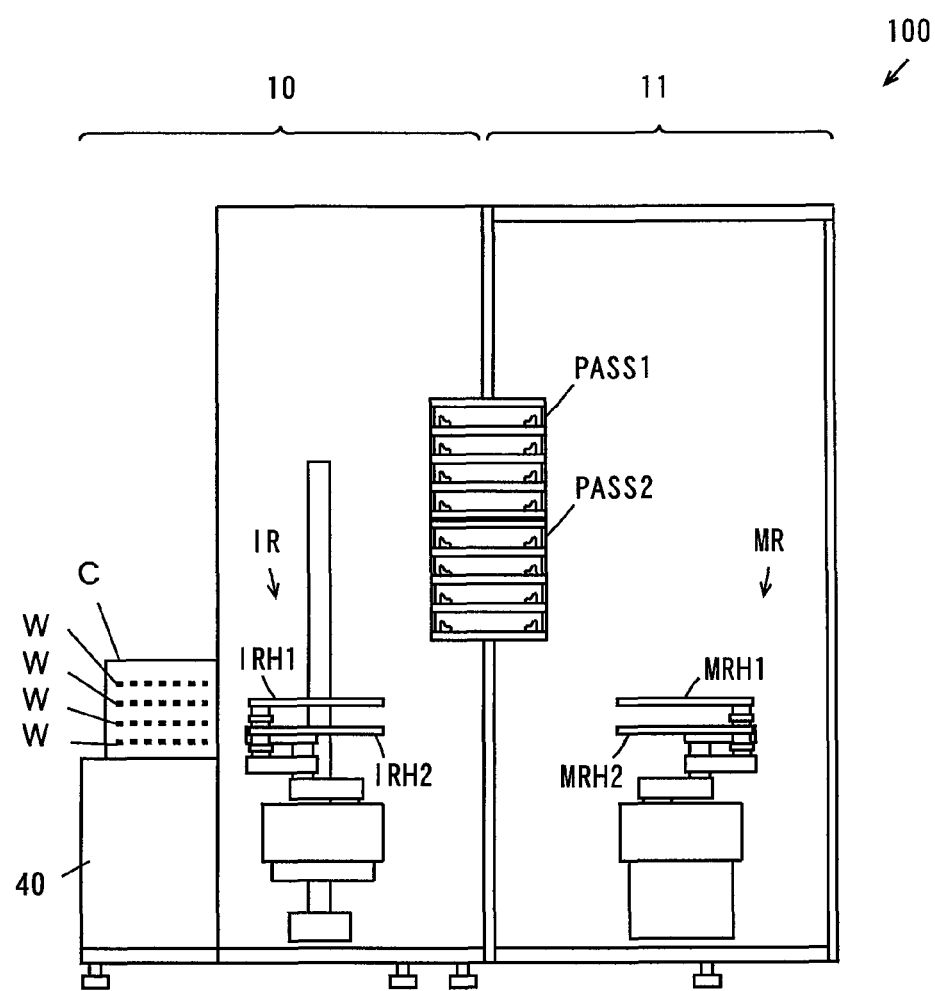
FIG. 2 is a diagram schematically showing a sectional view taken along the line A-A of FIG. 1 (*a*)

FIG. 1(*a*) is a plan view of a substrate processing apparatus according to a first embodiment of the present invention and FIG. 1(*b*) is a schematic side view in which the substrate processing apparatus of FIG. 1(*a*) is seen from the direction of the arrow X. FIG. 2 is a diagram schematically showing a cross section of FIG. 1 (*a*) taken along the line A-A.

As shown in FIG. 1(*a*), the substrate processing apparatus 100 includes an indexer block 10 and a processing block 11. The indexer block 10 and the processing block 11 are provided in parallel to each other.

The indexer block 10 is provided with a plurality of carrier platforms 40, an indexer robot IR and a controller 4. A carrier C that stores a plurality of substrates W in multiple stages is placed on each of the carrier platforms 40. Details of the carrier C will be described later.

The indexer robot IR is constructed so that it can move in the direction of the arrow U (FIG. 1 (*a*)), rotate around a vertical axis and move up and down. Hands IRH1, IRH2 for transferring and receiving the substrate W are provided one above the other in the indexer robot IR. The hands IRH1, IRH2 hold a peripheral portion of the lower surface of the substrate W and an outer circumference of the substrate W. Details of the indexer robot IR will be described later.

The controller 4 consists of a computer or the like including a CPU (central processing unit) and controls each component in the substrate processing apparatus 100.

As shown in FIG. 1 (b), a plurality of top surface cleaning units SS and a main robot MR are provided in the processing block 11. In this example, one side of the processing block 11 has a vertical stack of the four top surface cleaning units SS, and the other side of the processing block 11 has a vertical stack of another four top surface cleaning units SS.

The main robot MR is provided between the plurality of top surface cleaning units SS positioned on the one side of the processing bock 11 and the plurality of top surface cleaning units SS positioned on the other side of the processing block 11. The main robot MR is constructed so that it can rotate around a vertical axis and move up and down.

Moreover, hands MRH1, MRH2 for transferring and receiving the substrate Ware provided one above the other in the main robot MR. The hands MRH1, MRH2 hold the peripheral portion of the lower surface of the substrate W and the outer circumference of the substrate W. Details of the main robot MR will be described later.

As shown in FIG. 2, substrate platforms PASS1, PASS2 for transferring and receiving the substrate W between the indexer robot IR and the main robot MR are provided one above the other between the indexer block 10 and the processing block 11.

The plurality of substrates W can be placed in multiple stages in each of the substrate platforms PASS1, PASS2. The upper substrate platform PASS1 is used for transporting the substrate W from the processing block 11 to the indexer block 10, and the lower substrate platform PASS2 is used for transporting the substrate W from the indexer block 10 to the processing block 11. Details of the substrate platforms PASS1, PASS2 will be described later.

(2) Summary of Operations of the Substrate Processing Apparatus

Next, a summary of operation of the substrate processing apparatus 100 is described with reference to FIG. 1 and FIG. 2. Note that an operation of each structural element of the substrate processing apparatus 100, described below, is controlled by the controller 4 of FIG. 1.

First, the indexer robot IR takes the two unprocessed substrates W out of one of the carriers C placed on the carrier platforms 40 by using the two hands IRH1, IRH2 that are provided one above the other. The indexer robot IR rotates around the vertical axis while moving in the direction of the arrow U, and places the two unprocessed substrates W on the substrate platform PASS2.

The main robot MR moves up and down while rotating around the vertical axis, and receives the substrate W from the substrate platform PASS2 by using the lower hand MRH2. Next, the main robot MR takes the substrate W after top surface cleaning processing out of any of the top surface cleaning units SS by the upper hand MRH1, and carries the substrate W held by the hand MRH2 into the top surface cleaning unit SS. Then, the main robot MR again moves up and down while rotating around the vertical axis, and places the substrate W held by the upper hand MRH1 on the substrate platform PASS1.

The indexer robot IR takes the two processed substrates W out of the substrate platform PASS1 by using the two hands IRH1, IRH2. The indexer robot IR rotates around the vertical axis while moving in the direction of the arrow U, and stores the two processed substrates W in one of the carriers C placed on the carrier platforms 40.

In the substrate processing apparatus 100 according to the present embodiment, such transport operations of the substrate W by the indexer robot IR and the main robot MR are successively repeated.

(3) Configurations of the Carrier and the Substrate Platform

Figure 3:
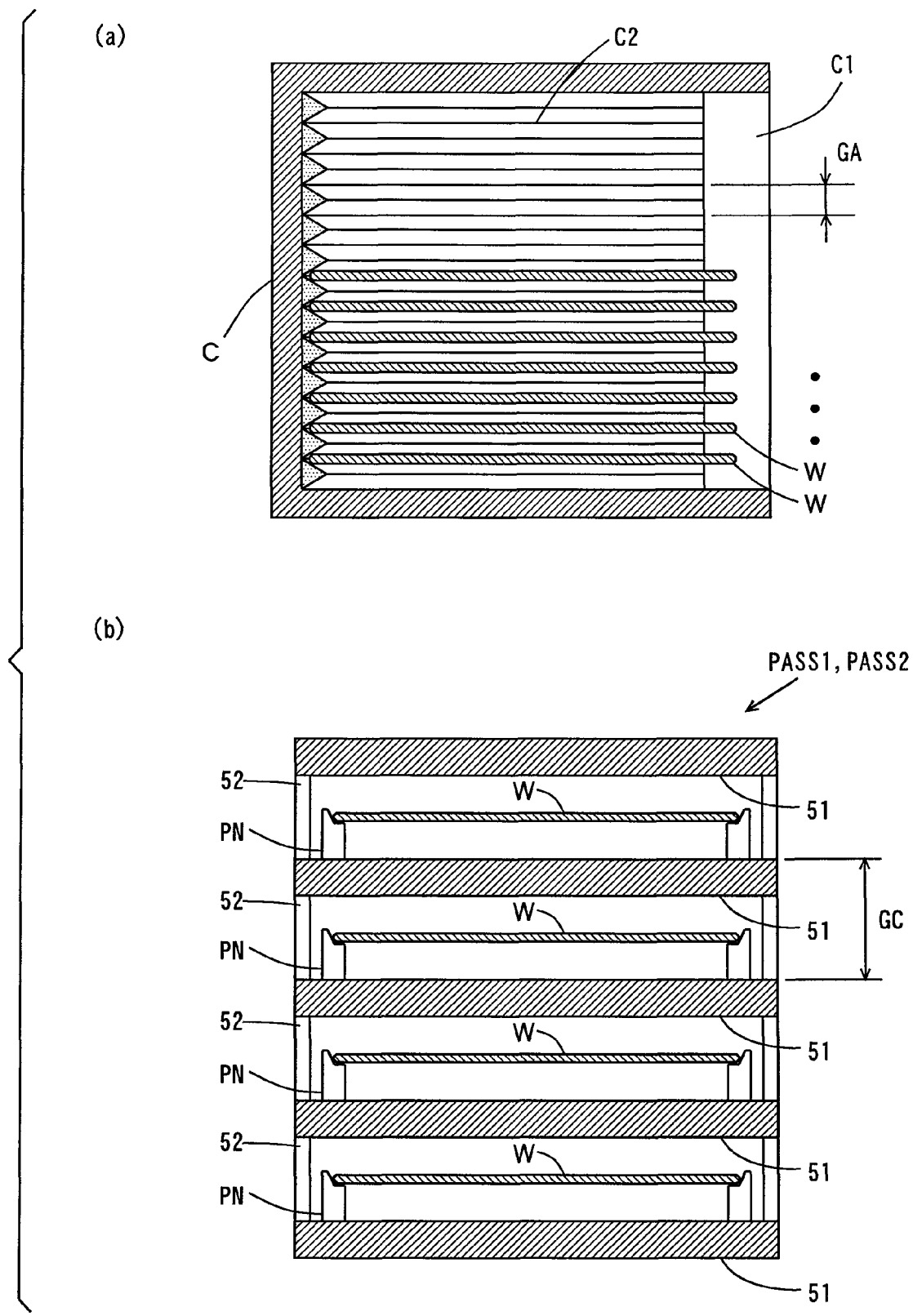
FIG. 3 is a vertical sectional view for explaining configurations of a carrier and a substrate platform of FIG. 1.

FIG. 3 is a vertical sectional view for explaining configurations of the carrier C and the substrate platform PASS1, PASS2 of FIG. 1.

FIG. 3 (a) shows a vertical sectional view of the carrier C of FIG. 1. As shown in FIG. 3 (a), the carrier C has a box shape with one face being open (an opening C1).

A plurality of substrate storing grooves C2 extending along a horizontal direction are formed inside the carrier C extending in a vertical direction.

Each of the substrate storing grooves C2 stores the substrate W. A spacing GA between the substrate storing grooves C2 that are vertically adjacent to each other is set to be approximately 10 mm, for example. In this case, the substrates W are stored at the spacing of about 10 mm in the carrier C. Reducing the spacing GA between the substrate storing grooves C2 allows a larger number of substrates W to be stored in the carrier C.

FIG. 3 (b) shows a vertical sectional view of the substrate platform PASS1, PASS2 of FIG. 1. As shown in FIG. 3 (b), the substrate platform PASS1, PASS2 has the configuration in which a plurality of support plates 51 are stacked in multiple stages by a plurality of support posts 52.

A plurality of support pins PN that support the lower surface of the substrate W are provided on the support plate 51. The substrate W is temporarily placed on the support pins PN of the substrate platform PASS1, PASS2 when the substrate W is transferred and received between the indexer robot IR and the main robot MR. In this substrate platform PASS1, PASS2, a spacing GC between the support plates 51 that are vertically adjacent to each other is approximately 45 mm, for example. In this case, the substrates Ware placed at the spacing of about 45 mm in the substrate platform PASS1, PASS2.

In the present embodiment, the spacing GC between the support plates 51 that are vertically adjacent to each other in the substrate platform PASS1, PASS2 is set to be larger than the spacing GA between the substrate storing grooves C2 of the carrier C.

Optical sensors (not shown) that detect the presence or absence of the substrate Ware provided per support plate 51 in the substrate platform PASS1, PASS2. This allows determination as to whether or not the substrate W is placed in the substrate platform PASS1, PASS2 to be made.

(4) Configuration of the Indexer Robot

Figure 4:
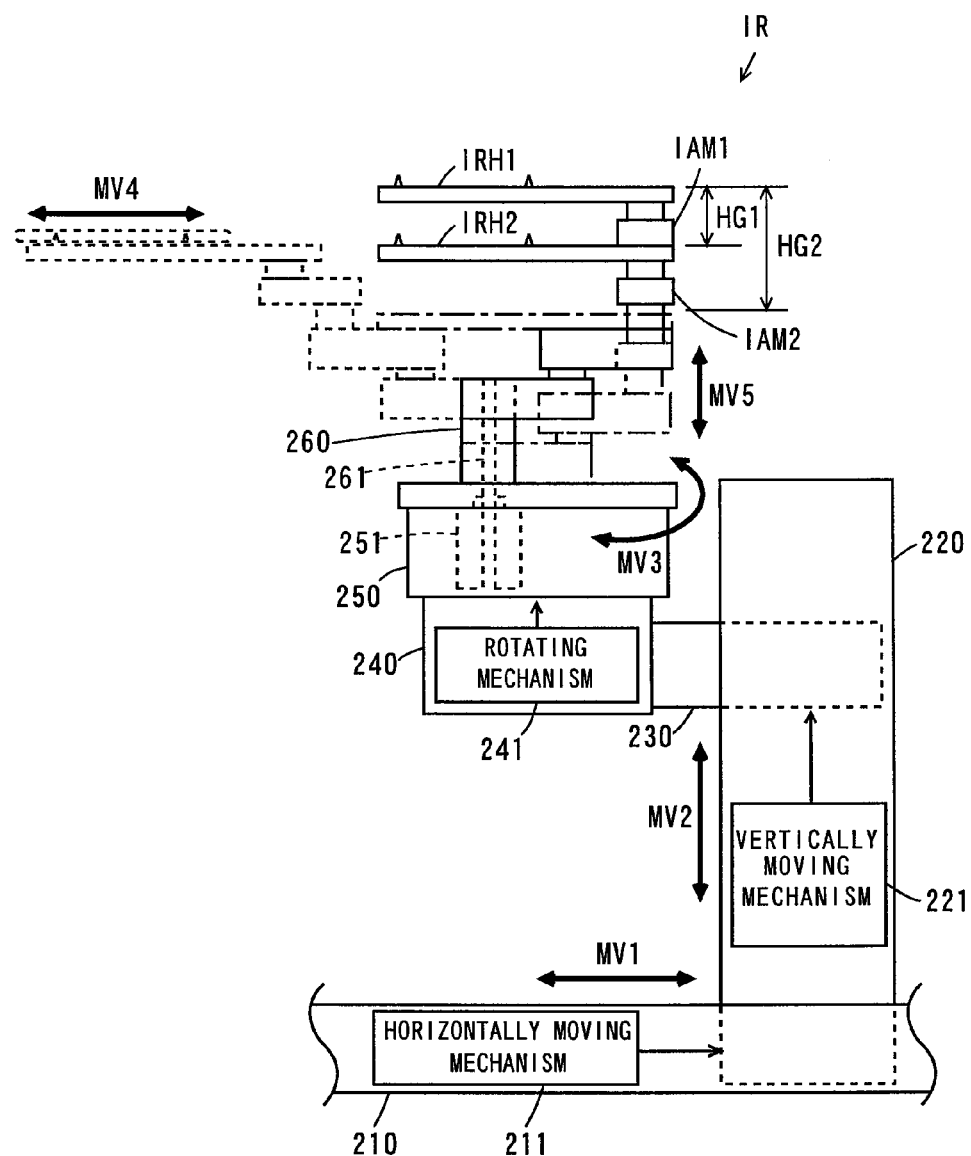
FIG. 4 is a side view of an indexer robot.

Next, the detailed configuration of the indexer robot IR is described. FIG. 4 is a side view of the indexer robot IR, and FIG. 5 is a plan view of the indexer robot IR.

Figure 5:
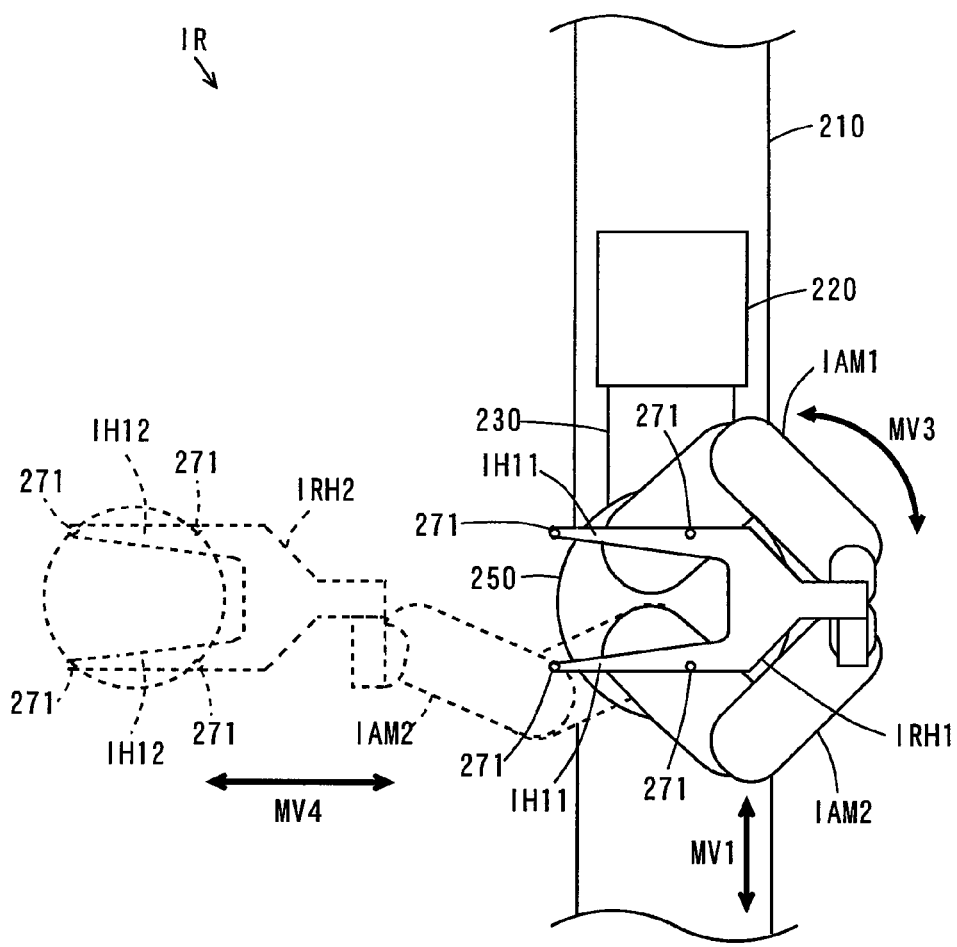
FIG. 5 is a plan view of the indexer robot.

As shown in FIG. 4 and FIG. 5, the indexer robot IR includes a transport rail 210, a moving support post 220, a lifting supporter 230 and a base 240.

The transport rail 210 is attached to the floor face of the indexer block 10. The moving support post 220 extending in the vertical direction is attached on the transport rail 210. One end of the lifting supporter 230 extending in the horizontal direction is attached to the moving support post 220. The base 240 is attached to the other end of the lifting supporter 230.

A horizontally moving mechanism 211 consisting of, for example, a set of a ball screw and a motor and the like is provided in the transport rail 210 extending in the horizontal direction. The moving support post 220 is moved along the transport rail 210 in the horizontal direction (the arrow MV1) by the horizontally moving mechanism 211.

A vertically moving mechanism 221 consisting of, for example, a ball screw, a motor and the like is provided in the moving support post 220. The lifting supporter 230 is moved along the moving support post 220 in the vertical direction (the arrow MV2) by the vertically moving mechanism 221. Accordingly, the base 240 can move in the horizontal and vertical directions.

A rotation stage 250 is provided on the base 240 so as to be rotatable with respect to the base 240. The rotation stage 250 is rotated by a rotating mechanism 241 (the arrow MV3) provided inside the base 240. The rotating mechanism 241 is constituted by, for example, a motor.

A lifting shaft 260 is provided so as to stand at the rotation stage 250. In addition, a hand IRH1 is connected to the upper surface of the rotation stage 250 by a multi-joint type arm IAM1, and a hand IRH2 is connected to the upper surface of the rotation stage 250 by the lifting shaft 260 and a multi-joint type arm IAM2.

The multi-joint type arms IAM1, IAM2 are independently driven by driving mechanisms that are not shown, respectively, and advance and withdraw the respective hands IRH1, IRH2 in the horizontal direction (the arrow MV4) while maintaining them in fixed postures.

The hand IRH1 is provided to have a certain height with respect to the rotation stage 250 and positioned above the hand IRH2.

A ball screw 261 is provided inside the lifting shaft 260. The ball screw 261 is connected to a motor 251 that is provided inside the rotation stage 250. The operation of the motor 251 rotates the ball screw 261, so that the multi-joint type arm IAM2 attached to the lifting shaft 260 is moved in the vertical direction (the arrow MV5).

Thus, a difference in height between the hand IRH1 and the hand IRH2 is changed within a predetermined range. In the example shown in FIG. 4, the difference in height between the hand IRH1 and the hand IRH2 when the multi-joint type arm IAM2 is moved to the highest position of the lifting shaft 260 is shown by an arrow HG1. Moreover, the difference in height between the hand IRH1 and the hand IRH2 when the multi-joint type arm IAM2 is moved to the lowest position of the lifting shaft 260 is shown by an arrow HG2.

The difference in height between the hand IRH1 and the hand IRH2 shown by the arrow HG1 is set to be equal to the spacing GA between the substrate storing grooves C2 of the carrier C of FIG. 3 (a), for example, and the difference in height between the hand IRH1 and the hand IRH2 shown by the arrow HG2 is set to be equal to the spacing GC between the support plates 51 of the substrate platform PASS1, PASS2 of FIG. 3 (b), for example.

As shown in FIG. 5, the hands IRH1, IRH2 have the same shape, and are formed to be substantially U-shaped, respectively. The hand IRH1 has two claw portions IH11 extending substantially in parallel to each other, and the hand IRH2 has two claw portions IH12 extending substantially in parallel to each other.

In addition, a plurality of support pins 271 are attached to the upper surfaces of the hands IRH1, IRH2, respectively. In the present embodiment, the respective four support pins 271 are attached on the upper surfaces of the hands IHR1, IRH2, at substantially equal distances from each other along the outer circumference of the substrate W placed thereon. The peripheral portion of the lower surface of the substrate W and the outer circumference of the substrate W are held by the four support pins 271.

Each of the hands IRH1, IRH2 has a thickness of approximately 4 mm, for example. Thus, the hands IRH1, IRH2 can be inserted between the plurality of substrates W stored in the carrier C of FIG. 3 (a).

The operations of the horizontally moving mechanism 211, the vertically moving mechanism 221, the rotating mechanism 241 and the motor 251, mentioned above, are controlled by the controller 4 of FIG. 1.

(5) Configuration of the Main Robot

Figure 6:
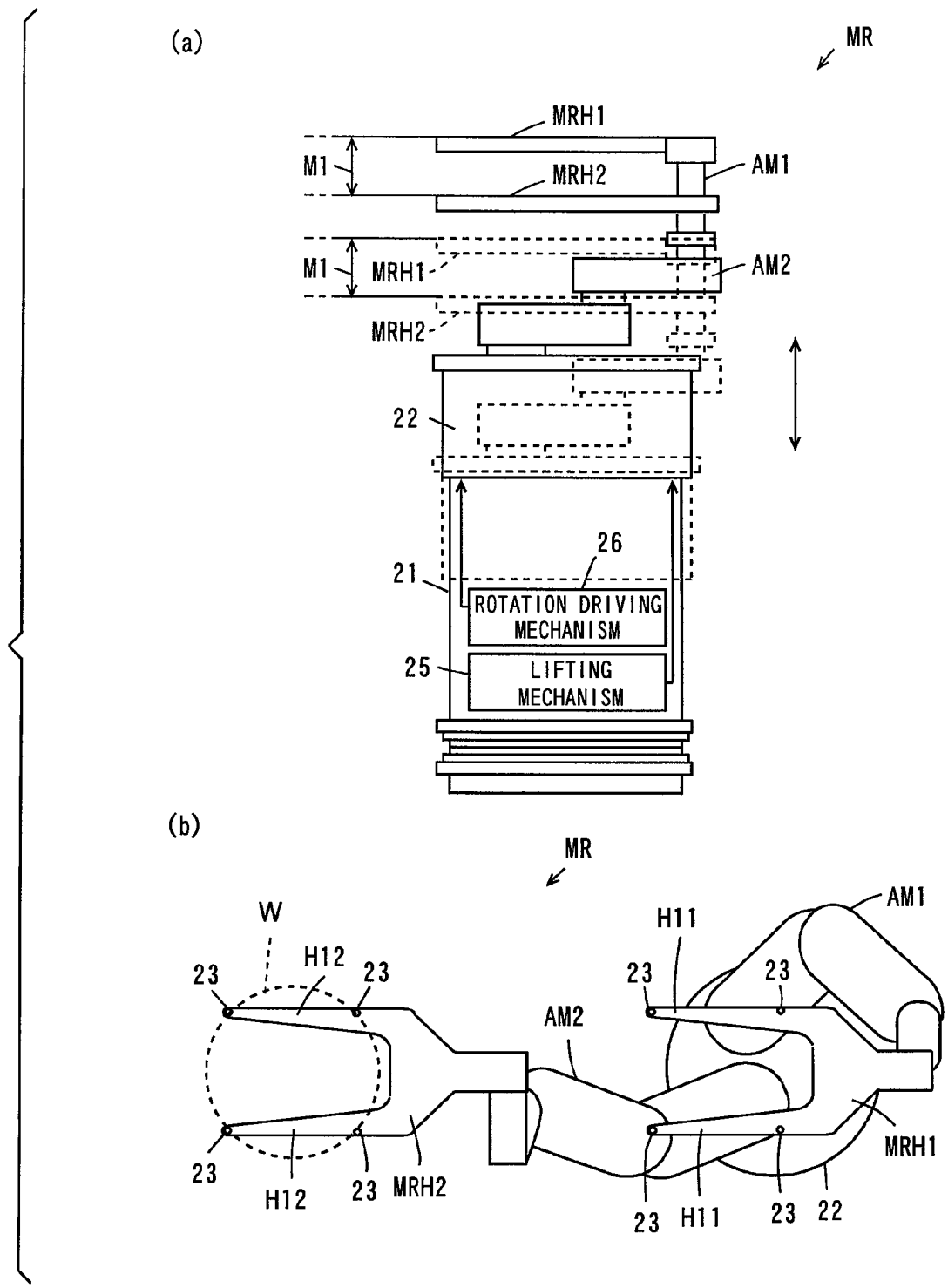
FIG. 6 is a side view and a plan view of a main robot.

Next, a detailed configuration of the main robot MR is described. FIG. 6 (a) is a side view of the main robot MR, and the FIG. 6 (b) is a plan view of the main robot MR.

As shown in FIG. 6 (a) and FIG. 6(b), the main robot MR includes a base 21, to which a moving portion 22 is attached so as to be able to vertically move and rotate with respect to the base 21. The hands MRH1 and MRH2 are connected to the moving portion 22 by the multi-joint type arms AM1 and AM2, respectively.

The moving portion 22 is rotated around the vertical axis by a rotation driving mechanism 26 that is provided in the base 21 while being moved up and down by a lifting mechanism 25 that is provided in the base 21.

The multi-joint type arms AM1, AM2 are independently driven by driving mechanisms that are not shown, respectively, and advance and withdraw the respective hands MRH1, MRH2 in the horizontal direction while maintaining them in fixed postures.

The hands MRH1, MHR2 are provided to have certain heights with respect to the moving portion 22, respectively, and the hand MRH1 is positioned above the hand MRH2. A difference M1 (FIG. 6(a)) in height between the hand MRH1 and the hand MRH2 is maintained constant.

Note that the difference M1 in height between the hand MRH1 and the hand MRH2 may be set to be substantially equal to, for example, the spacing GC between the support plates 51 that are vertically adjacent to each other in the substrate platform PASS1, PASS2 shown in FIG. 3 (b).

The hands MRH1, MRH2 have the same shape, and are formed to be substantially U-shaped, respectively. The hand MRH1 has two claw portions H11 extending substantially in parallel to each other, and the hand MRH2 has two claw portions H12 extending substantially in parallel to each other. In addition, a plurality of support pins 23 are attached on the upper surfaces of the hands MRH1, MRH2, respectively.

In the present embodiment, the respective four support pins 23 are attached on the upper surfaces of the hands MHR1, MRH2, at substantially equal distances from each other along the outer circumference of the substrate W placed thereon. The peripheral portion of the lower surface of the substrate W and the outer circumference of the substrate W are held by the four support pins 23.

Each of the hands MRH1, MRH2 is formed to be thicker than the hands IRH1, IRH2 of the indexer robot IR, and has a thickness of approximately 7 mm, for example. Accordingly, the hands MRH1, MRH2 have high rigidity compared to the hands IRH1, IRH2 of the indexer robot IR.

Moreover, heights of the support pins PN are set so that the hands MRH1, MRH2 of the main robot MR can be easily inserted between the support plate 51 and the substrate W in the substrate platform PASS1, PASS2 of FIG. 3 (b).

(6) Details of the Top Surface Cleaning Unit

Figure 7:
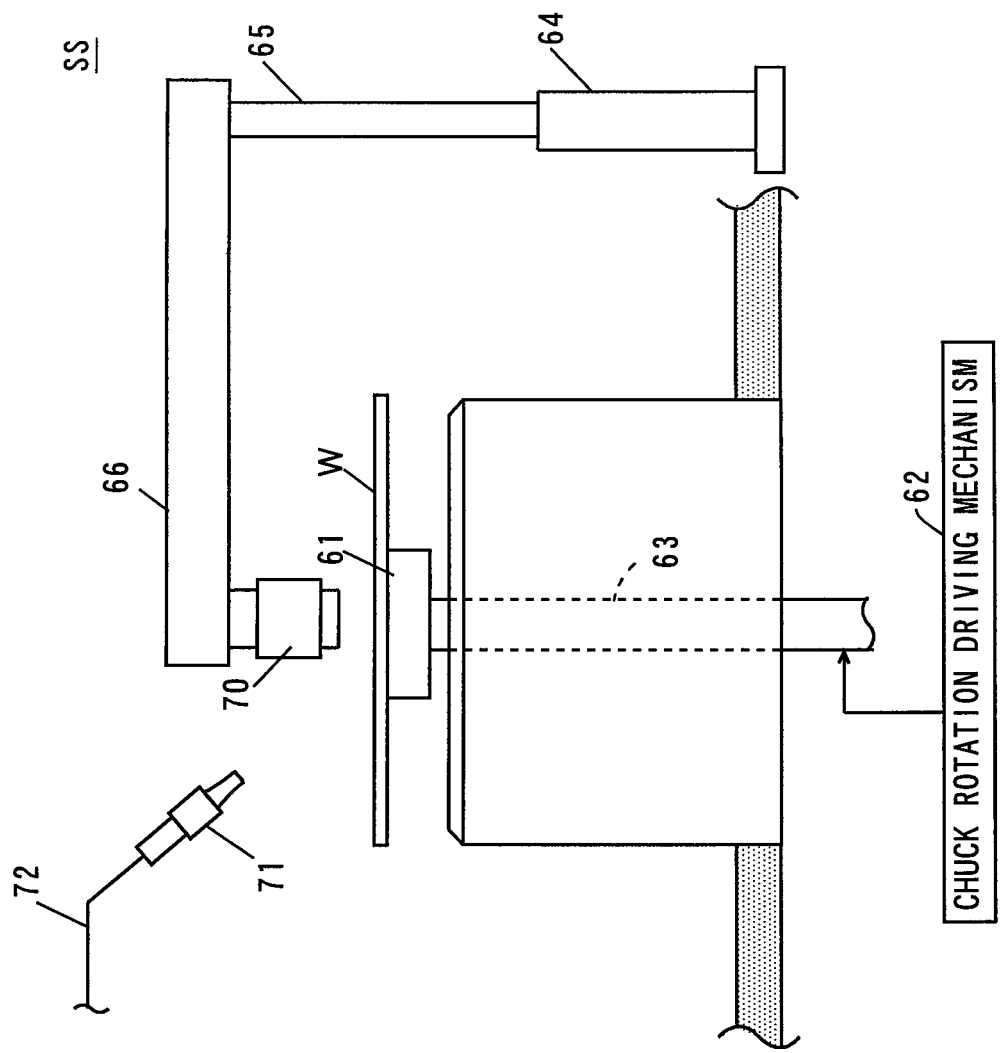
FIG. 7 is a diagram for explaining a configuration of a top surface cleaning unit.

Next, the top surface cleaning unit SS shown FIG. 1 is described. FIG. 7 is a diagram for explaining a configuration of the top surface cleaning unit SS. In the top surface cleaning unit SS shown in FIG. 7, the cleaning processing of the substrate W by using a brush (hereinafter referred to as the scrub cleaning processing) is performed.

First, the details of the top surface cleaning unit SS is described with reference to FIG. 7. As shown in FIG. 7, the top surface cleaning unit SS includes a spin chuck 61 for rotating the substrate W around a vertical axis passing through the center of the substrate W while holding the substrate W horizontally. The spin chuck 61 is secured to the upper end of a rotation shaft 63 that is rotated by a chuck rotation driving mechanism 62.

As described above, the substrate W with the top surface thereof directed upward is carried into the top surface cleaning unit SS. When the scrub cleaning processing is performed, the back surface of the substrate W is held by suction on the spin chuck 61.

A motor 64 is provided outside the spin chuck 61. A rotation shaft 65 is connected to the motor 64. An arm 66 is coupled to the rotation shaft 65 so as to extend in the horizontal direction, and a substantially cylindrical brush cleaner 70 is provided on the tip of the arm 66.

In addition, above the spin chuck 61, a liquid discharge nozzle 71 is provided for supplying a cleaning liquid or a rinse liquid (pure water) onto the top surface of the substrate W held by the spin chuck 61.

The liquid discharge nozzle 71 is connected to a supply pipe 72, and the cleaning liquid and the rinse liquid are selectively supplied to the liquid discharge nozzle 71 through this supply pipe 72.

In the scrub cleaning processing, the motor 64 rotates the rotation shaft 65. Thus, the arm 66 turns within a horizontal plane, and the brush cleaner 70 moves between a position outside the substrate W and a position above the center of the substrate W, centered around the rotation shaft 65. A lifting mechanism (not shown) is provided in the motor 64. The lifting mechanism lifts and lowers the brush cleaner 70 in the position outside the substrate W and the position above the center of the substrate W by lifting and lowering the rotation shaft 65.

When the scrub cleaning processing is started, the substrate W with the top surface thereof directed upward is rotated by the spin chuck 61. Moreover, the cleaning liquid or the rinse liquid is supplied to the liquid discharge nozzle 71 through the supply pipe 72. Thus, the cleaning liquid or the rinse liquid is supplied onto the top surface of the substrate W that rotates. In this state, the brush cleaner 70 is swung and moved up and down by the rotation shaft 65 and the arm 66. Accordingly, the scrub cleaning processing is performed on the top surface of the substrate W. Note that since the suction-type spin chuck 61 is used in the top surface cleaning unit SS, the peripheral portion and the outer circumference of the substrate W can be simultaneously cleaned.

(7) Effects

As described with reference to FIG. 4, the difference in height between the hand IRH1 and the hand IRH2 in the indexer robot IR can be changed within a predetermined range.

Thus, the indexer robot IR can adjust the difference in height between the hand IRH1 and the hand IRH2 to be small (approximately 10 mm, for example), corresponding to the spacing GA between the substrate storing grooves C2 that are vertically adjacent to each other when taking the two substrates W out of the carrier C.

Accordingly, the indexer robot IR can insert the hand IRH1 and the hand IRH2 between the plurality of substrates W stored in the carrier C, and easily take out the two substrates W stored vertically adjacent to each other.

In addition, the indexer robot IR can adjust the difference in height between the hand IRH1 and the hand IRH2 to be larger (approximately 45 mm, for example), corresponding to the spacing GC between the support plates 51 that are vertically adjacent to each other during the transport of the taken out two substrates W to the substrate platform PASS2.

Thus, the indexer robot IR can easily place the two substrates W held by the hand IRH1 and the hand IRH2 on the support plates 51 that are vertically adjacent to each other in the substrate platform PASS2.

Furthermore, the indexer robot IR can similarly adjust the difference in height between the hand IRH1 and the hand IRH2 when transporting the two substrates W from the substrate platform PASS1 to the carrier C.

Thus, the two substrates W at a time can be transported between the carrier C and the substrate platforms PASS1, PASS2. This allows the transport time of the substrate W between the carrier C and the substrate platforms PASS1, PASS2 to be reduced and the improvement of the throughput in the substrate processing apparatus 100 to be achieved.

Note that since the multi-joint type arms IAM1, IAM2 are independently driven by the driving mechanisms that are not shown, respectively, in the indexer robot IR, it is also possible that the substrates W are transported one by one between the carrier C and the substrate platforms PASS1, PASS2.

(8) Modifications

While the top surface of the substrate W is cleaned by using the brush in the top surface cleaning unit SS in the present embodiment, the present invention is not limited to this and the top surface of the substrate W can be cleaned by using a chemical liquid.

In addition, while the main robot MR uses the hand MRH2 for holding the unprocessed substrate W and uses the hand MRH1 for holding the substrate W subjected to the scrub cleaning processing, conversely, the hand MRH1 may be used for holding the unprocessed substrate Wand the hand MRH2 may be used for holding the substrate W subjected to the scrub cleaning processing.

Moreover, while the multi-joint type transport robots that linearly advance and withdraw their hands by moving their joints are used as the indexer robot IR and the main robot MR in the above-described embodiment, the present invention is not limited to this and linear-type transport robots that advance and withdraw their hands by linearly sliding them with respect to the substrate W may be used.

In the present embodiment, when the difference M1 (FIG. 6 (*a*)) in height between the hand MRH1 and the hand MRH2 is set to be substantially equal to the spacing GC between the support plates 51 that are vertically adjacent to each other in the substrate platform PASS1, PASS2 shown in FIG. 3(*b*), the main robot MR may transfer and receive the two substrates W to and from the substrate platforms PASS1, PASS2.

In this case, the main robot MR can insert the hand MRH1 and the hand MRH2 between the support plates 51 that are adjacent to each other in the substrate platform PASS1, PASS2, and easily take out the two substrates W placed vertically adjacent to each other. Furthermore, the two substrates W held by the hand MRH1 and the hand MRH2 can be placed on the support plates 51 that are adjacent to each other in the substrate platform PASS1, PASS2.

Accordingly, the transport time of the substrate W between the substrate platforms PASS1, PASS2 and the top surface cleaning unit SS can be reduced.

While the two hands IRH1, IRH2 are provided in the indexer robot IR in the present embodiment, the number of the hands provided in the indexer robot IR is not limited as long as it is not less than two. The number of the hands may be three or four, for example.

[2] Second Embodiment

A configuration of a substrate processing apparatus according to a second embodiment is different from the configuration of the substrate processing apparatus 100 according to the first embodiment in the following points.

(1) Configuration of Substrate Platform

Figure 8:
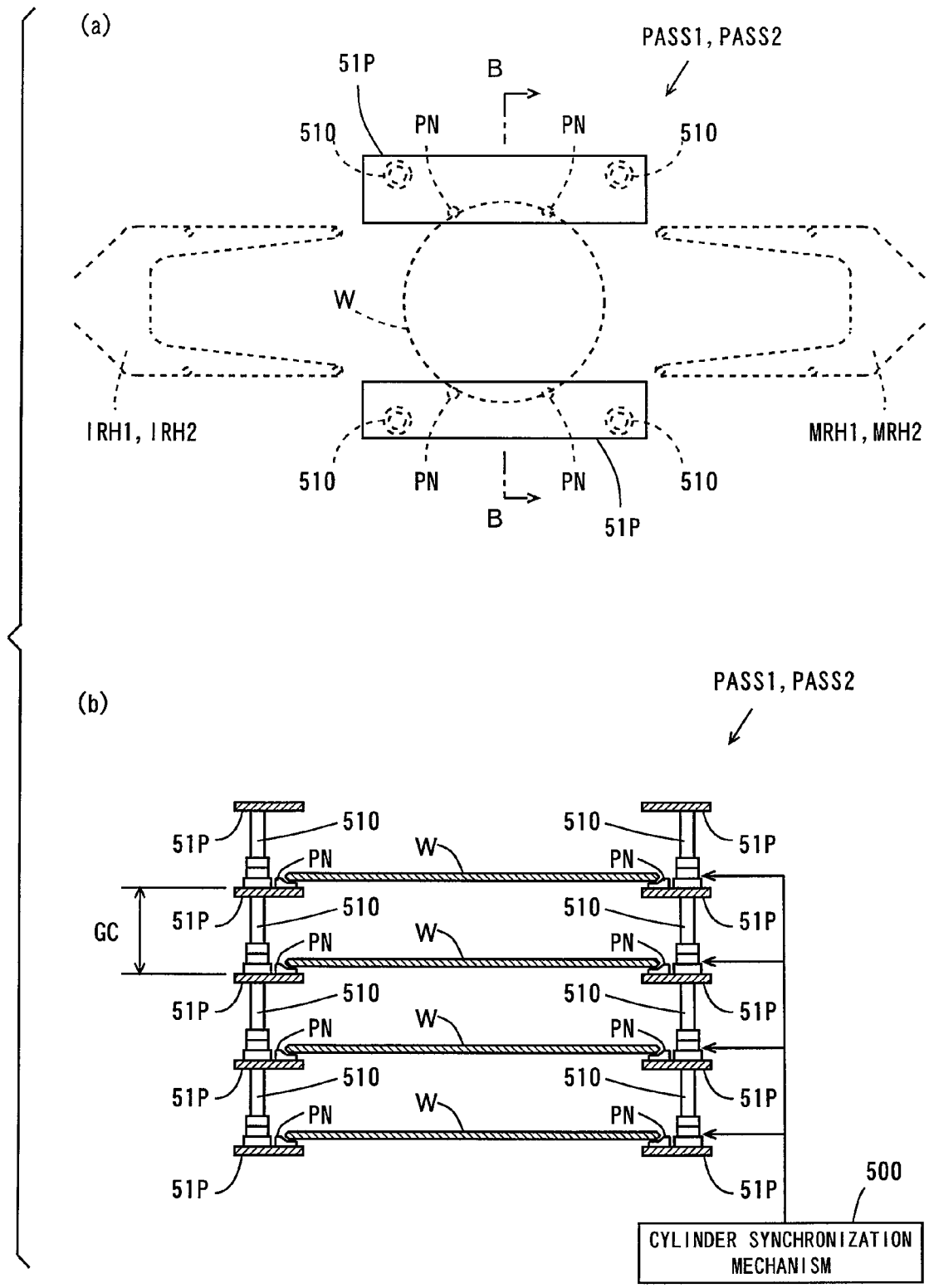
FIG. 8 is a diagram for explaining a configuration of a substrate platform used for a substrate processing apparatus according to a second embodiment.

A substrate platform used in the substrate processing apparatus according to the present embodiment has the following configuration. FIG. 8 is a diagram for explaining the configuration of the substrate platform used for the substrate processing apparatus according to the second embodiment.

FIG. 8 (a) shows a plan view of the substrate platform PASS1, PASS2 of the present embodiment, and FIG. 8 (b) shows a cross section of FIG. 8 (a) taken along the line B-B.

As shown in FIG. 8 (a) and FIG. 8 (b), the substrate platform PASS1, PASS2 of the present embodiment includes a plurality of sets of support plates 51P arranged so as to face each other within the horizontal plane. The sets of support plates 51P are stacked in multiple stages by a plurality of cylinders 510. The plurality of support pins PN that support the lower surface of the substrate W are provided on each set of support plates 51P.

The hands IRH1, IRH2 of the indexer robot IR and the hands MRH1, MRH2 of the main robot MR can be inserted between the sets of two support plates 51P. Accordingly, the substrate W transported by the indexer robot IR and the main robot MR is temporarily placed on the plurality of support pins PN provided on each set of support plates 51P.

An air cylinder, an oil cylinder or the like is used as the above-mentioned cylinder 510, for example. Each of the cylinders 510 is connected to a cylinder synchronization mechanism 500. The cylinder synchronization mechanism 500 is controlled by the controller 4 and supplies a fluid (for example, air, oil or the like) to the plurality of cylinders 510 while synchronizing the plurality of cylinders 510.

Thus, each of the cylinders 510 performs a telescoping operation in the vertical direction depending on a supply amount of the fluid (for example, air, oil or the like) from the cylinder synchronization mechanism 500. Accordingly, the spacing GC between the support plates 51P that are vertically adjacent to each other is changed within a predetermined range in the substrate platforms PASS1, PASS2 of the present embodiment.

Figure 9:
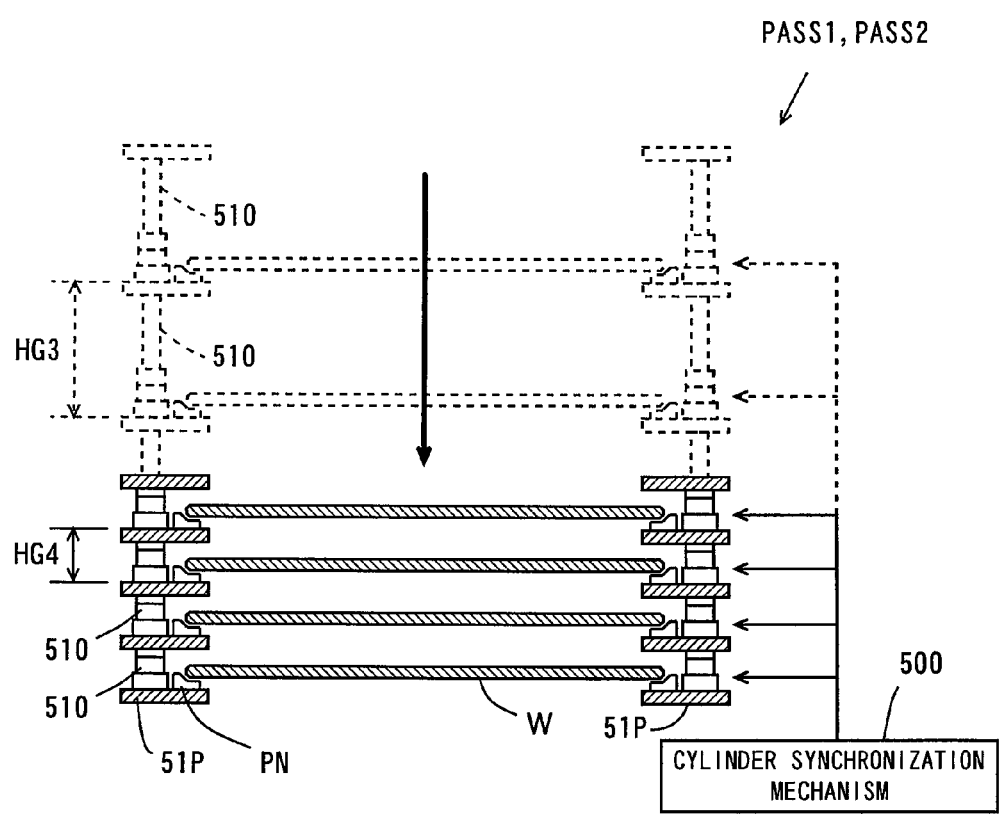
FIG. 9 is a diagram showing an example of a case where a spacing between support plates that are vertically adjacent to each other is changed in the substrate platform of FIG. 8.

FIG. 9 is a diagram showing an example of the case where the spacing GC between the support plates 51P that are vertically adjacent to each other is changed in the substrate platform PASS1, PASS2 of FIG. 8.

As shown in FIG. 9, the spacing GC between the support plates 51P that are vertically adjacent to each other is changed from a maximum spacing HG3 shown by the dotted line to a minimum spacing HG4 shown by the solid line, for example.

The maximum spacing HG3 between the support plates 51P is set to be substantially equal to the difference M1 in height between the hand MRH1 and the hand MRH2 of the main robot MR of FIG. 6 (a), for example. The minimum spacing HG4 between the support plates 51P is set to be approximately 10 mm, for example, so as to be equal to, for example, the spacing GA of FIG. 3 (a).

Note that the maximum spacing HG3 between the support plates 51P may be set to be approximately 45 mm so as to be equal to, for example, the spacing GC of FIG. 3 (b).

Also in the substrate platforms PASS1, PASS2 of the present embodiment, optical sensors (not shown) that detect the presence or absence of the substrate W are provided corresponding to each set of support plates 51P.

(2) Configuration of the Indexer Robot

Figure 10:
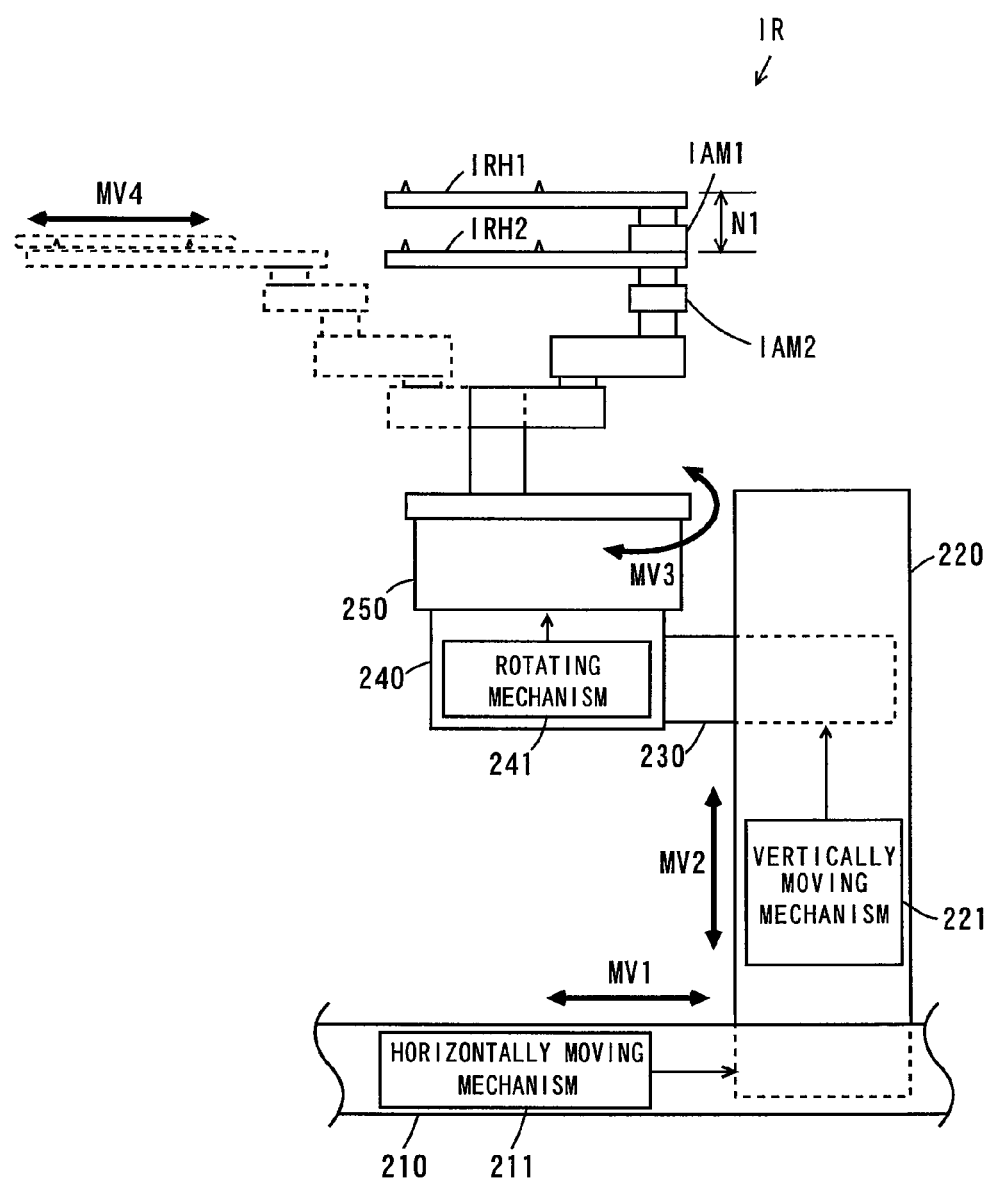
FIG. 10 is a side view of an indexer robot used for the substrate processing apparatus according to the second embodiment.
Figure 11:
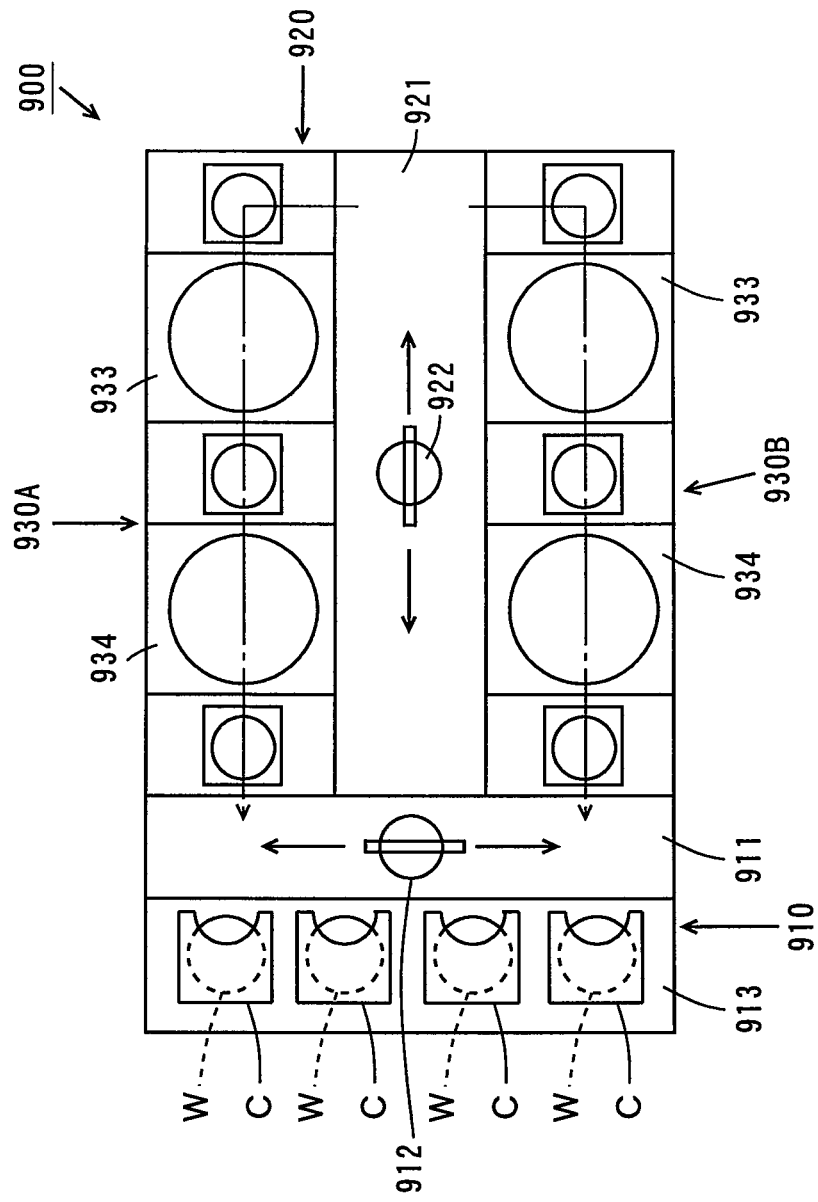
FIG. 11 is a plan view showing a substrate processing apparatus described in JP 10-150090 A.

FIG. 10 is a side view of the indexer robot IR used for the substrate processing apparatus according to the second embodiment. As shown in FIG. 10, the motor 251, the lifting shaft 260 and the ball screw 261 of FIG. 4 are not provided in the indexer robot IR of the present embodiment.

The hand IRH1 is connected to the upper surface of the rotation stage 250 by the multi-joint type arm IAM1 and the hand IRH2 is connected to the upper surface of the rotation stage 250 by the multi-joint type arm IAM2 in the indexer robot IR of the present embodiment.

Accordingly, the multi-joint type arms IAM1, IAM2 do not move in the vertical direction to the rotation stage 250, and are provided to have certain heights from the rotation stage 250. Thus, a difference N1 (FIG. 10) in height between the hand IRH1 and the hand IRH2 is maintained constant.

Here, the difference N1 in height between the hand IRH1 and the hand IRH2 is set to be, for example, approximately 10 mm so as to be equal to, for example, the spacing GA of FIG. 3 (a).

(3) Effects

In the present embodiment, the difference N1 (FIG. 10) in height between the hand IRH1 and the hand IRH2 in the indexer robot IR is set to be equal to the spacing GA between the substrate storing grooves C2 that are vertically adjacent to each other in the carrier C.

Accordingly, the indexer robot IR can insert the hand IRH1 and the hand IRH2 between the plurality of substrates W stored in the carrier C for taking the two substrates W out of the carrier C. Thus, the two substrates W stored vertically adjacent to each other are easily taken out of the carrier C.

Here, as described with reference to FIG. 8 and FIG. 9, the spacing GC between the support plates 51P that are vertically adjacent to each other in the substrate platform PASS1, PASS2 is changed within the predetermined range.

Thus, the spacing GC between the support plates 51 that are vertically adjacent to each other can be adjusted to be the minimum spacing HG4 in the substrate platforms PASS1, PASS2 when the two substrates W are transported by the indexer robot IR, for example.

As described above, the minimum spacing HG4 between the support plates 51P is equal to the spacing GA between the substrate storing grooves C2 that are vertically adjacent to each other in the carrier C. Accordingly, the indexer robot IR can easily place the two substrates W held by the hand IRH1 and the hand IRH2 on the support plates 51P in the substrate platform PASS2 since the difference N1 in height between the hand IRH1 and the hand IRH2 is equal to the spacing GA between the substrate storing grooves C2.

Furthermore, the indexer robot IR can easily take out the two substrates W placed on the support plates 51P in the substrate platform PASS1 by using the hand IRH1 and the hand IRH2.

Thus, also in the substrate processing apparatus 100 according to the present embodiment, the two substrates W at a time can be transported between the carrier C and the substrate platforms PASS1, PASS2. This allows the improvement of the throughput in the substrate processing apparatus 100 to be achieved.

The spacing GC between the support plates 51 that are vertically adjacent to each other can be adjusted to be the maximum spacing HG3 in the substrate platforms PASS1, PASS2 when the substrates W are transported to the top surface cleaning unit SS by the main robot MR, for example.

The maximum spacing HG3 between the support plates 51P is sufficiently larger than the spacing GA between the substrate storing grooves C2 that are vertically adjacent to each other in the carrier C, and is substantially equal to the difference M1 in height between the hand MRH1 and the hand MRH2 of the main robot MR.

Accordingly, the hands MRH1, MRH2 of the main robot MR having larger thicknesses than those of the hands IRH1, IRH2 of the indexer robot IR are easily inserted between the plurality of substrates W placed on the support plates 51P in the substrate platforms PASS1, PASS2. This allows the substrates W to be reliably transferred and received between the main robot MR and the substrate platforms PASS1, PASS2.

[3] Correspondences Between Structural Elements in Claims and Elements in the Embodiments In the following paragraphs, non-limiting examples of correspondences between various elements recited in the claims below and those described above with respect to various embodiments of the present invention are explained.

In the above described embodiments, the carrier C is an example of a storing container, the support plates 51, 51P are examples of a storing shelf, the substrate platforms PASS1, PASS2 are examples of a substrate platform shelf and an interface and the indexer robot IR is an example of a substrate transporting apparatus and a first substrate transporting apparatus.

The transport rail 210, the horizontally moving mechanism 211, the moving support post 220, the vertically moving mechanism 221, the lifting supporter 230, the base 240, the rotating mechanism 241, the rotation stage 250 and the multijoint type arms IAM1, IAM2 are examples of a driving mechanism.

The hand IRH1 is an example of a first substrate holder, the hand IRH2 is an example of a second substrate holder, the motor 251, the lifting shaft 260 and the ball screw 261 as well as the cylinder synchronization mechanism 500 and the cylinder 510 are examples of an adjusting mechanism.

The hand MRH1 is an example of a third holder, the hand MRH2 is an example of a fourth holder, the main robot MR is an example of a second substrate transporting apparatus, the support pin PN is an example of a support member, the processing block 11 is an example of a processing region, the indexer robot 10 is an example of a carrying in and out region, the carrier platform 40 is an example of a container platform, and the top surface cleaning unit SS is an example of a processing unit and a cleaning processing unit.

Note that as each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate transporting method for transporting a substrate between a storing container having a plurality of stages of storing grooves where the substrate is stored in a substantially horizontal posture, a substrate platform shelf having a plurality of stages of storing shelves where the substrate is placed in the substantially horizontal posture, and a processing unit that performs processing on the substrate by first and second substrate transporting apparatuses, wherein a difference in height between said plurality of stages of storing grooves of said storing container differs from a difference in height between said plurality of stages of storing shelves of said substrate platform shelf, said first substrate transporting apparatus has first and second substrate holders that are provided one above the other, said second substrate transporting apparatus has third and fourth substrate holders that are provided one above the other, and said processing unit is a cleaning processing unit that cleans an unprocessed substrate as said processing and is configured to perform said processing on the substrate one by one, said substrate platform shelf includes a first substrate platform shelf having a plurality of stages of storing shelves on which a substrate before cleaning that is not cleaned by said processing unit is placed, and a second substrate platform shelf having a plurality of stages of storing shelves on which a substrate after cleaning that is cleaned by said processing unit is placed, said first substrate transporting apparatus transports a substrate between said storing container and said substrate platform shelf, said second substrate transporting apparatus transports a substrate between said substrate platform shelf and said processing said third and fourth substrate holders each have a higher rigidity than a rigidity of each of said first and second substrate holders, said substrate platform shelf and said second substrate transporting apparatus are arranged in line in a first direction, said second substrate transporting apparatus and said processing unit are arranged in line in a second direction crossing said first direction, and said substrate transporting method comprising the steps of:

adjusting a difference in height between said first and second substrate holders of said first substrate transporting apparatus to be the same as the difference in height between said plurality of stages of storing grooves of said storing container, and receiving a plurality of the substrates before cleaning, stored in said plurality of stages of storing grooves by said first and second substrate holders, or transferring a plurality of the substrates after cleaning, held respectively by said first and second substrate holders to said plurality of stages of storing grooves;

adjusting the difference in height between said first and second substrate holders of said first substrate transporting apparatus to be the same as the difference in height between said plurality of stages of storing shelves of said substrate platform shelf, and transferring the plurality of substrates before cleaning, held respectively by said first and second substrate holders to said plurality of stages of storing shelves of said first substrate platform shelf, or receiving the plurality of substrates after cleaning, placed on said plurality of stages of storing shelves of said second substrate platform shelf by said first and second substrate holders;

receiving any one of the plurality of substrates before cleaning, stored in said plurality of stages of storing shelves of said first substrate platform shelf by one of said third and fourth substrate holders of said second substrate transporting apparatus, and transferring the substrate after cleaning, held by the other of said third and fourth substrate holders of said second substrate transporting apparatus to any one of said plurality of stages of storing shelves of said second substrate platform shelf; and receiving the substrate after cleaning in said processing unit by one of said third and fourth substrate holders of said second substrate transporting apparatus and transferring the substrate before cleaning, held by the other of said third and fourth substrate holders of said second substrate transporting apparatus to said processing unit;

wherein said step of receiving the substrate after cleaning in said processing unit by one of said third and fourth substrate holders of said second substrate transporting apparatus and transferring the substrate before cleaning, held by the other of said third and fourth substrate holders to said processing unit includes the step of:

rotating said second substrate transporting apparatus from a direction toward said storing shelf to a direction toward said processing unit after said step of receiving the substrate before cleaning by one of said third and fourth substrate holders and transferrin the substrate after cleaning the other of said third and fourth substrate holders.

2. The substrate transporting method according to claim 1, wherein said first substrate platform shelf and said second substrate platform shelf are arranged one above the other such that said first substrate platform shelf is positioned below said second substrate platform shelf, said third substrate holder and said fourth substrate holder are arranged one above the other such that said third substrate holder is positioned below said fourth substrate holder, said third substrate holder holds only the substrate before cleaning by said processing unit, and said fourth substrate holder holds only the substrate after cleaning by said processing unit.

* * * * *